Sept. 15, 1959 R. E. HALSTED 2,904,697

SIGNAL TRANSLATING DEVICES AND CIRCUITS

Filed July 12, 1956

Inventor:
Richard E. Halsted,
by Richard R. Brainard
His Attorney.

United States Patent Office 2,904,697

Patented Sept. 15, 1959

2,904,697

SIGNAL TRANSLATING DEVICES AND CIRCUITS

Richard E. Halsted, Ballston Lake, N.Y., assignor to General Electric Company, a corporation of New York Application July 12, 1956, Serial No. 597,547

7 Claims. (Cl. 250—213)

The present invention relates to circuits and systems for the translation of electrical signals. More particularly, the invention relates to such circuits and systems in which electrical signal translation is accomplished through non-distortive voltage modulation of photoluminescence.

In the electronics art, a number of circuit elements and circuits are available for the translation of electrical signals. The particular circuit or circuit element best suited for a particular application depends, in part, upon the particular needs of the proposed use and the manner in which the characteristics of a translating device or circuit suit the proposed use. Among the characteristics of devices and circuits taken into consideration are electrical gain, bandwidth, absence of distortion, possibility of electrical isolation between electrical input and electrical output, power consumption, size, durability and cost. Presently available signal translating devices and circuits all are objectionable when considered with respect to one or more of the aforementioned characteristics.

Accordingly, one object of the invention is to provide novel signal translating devices and circuits which are superior to presently available signal translating devices and circuits from an overall consideration of electrical gain, bandwidth, absence of distortion, electrical isolation between electrical output and electrical input, power consumption, size, durability and cost.

Another object of the invention is to provide new and improved signal translating devices and circuits which utilize voltage modulation of photoluminescence.

Briefly stated, in accord with one aspect of my invention I provide a signal translating device including a photoluminescent phosphor member and a photosensitive member located in radiation coupled relationship. Means are provided for shielding the photosensitive member from all radiation to which it is sensitive other than that emitted by the photoluminescent phosphor. Means are also provided for impressing an electrical signal in the form of low level alternating electrical fields of the order of from 10 to $10^3$ volts per centimeter across the photoluminescent member.

When this device is connected in electrical circuit relationship so that the photoluminescent member is irradiated by unpulsed radiation having a wavelength shorter than the fundamental absorption edge of the phosphor, and a source of electrical energy and a load device are connected in circuit relationship with the photosensitive device, weak electrical signals of a wide bandwidth are translated, achieving electrical gain at low signal levels with low distortion and with negligible electrical coupling between input and output circuits.

Figure 2:
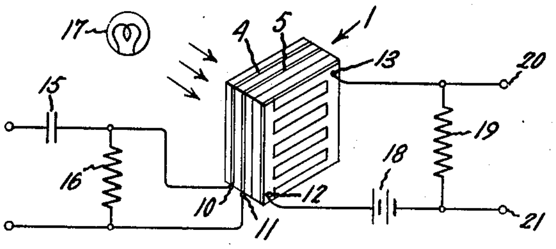
Figure 3:
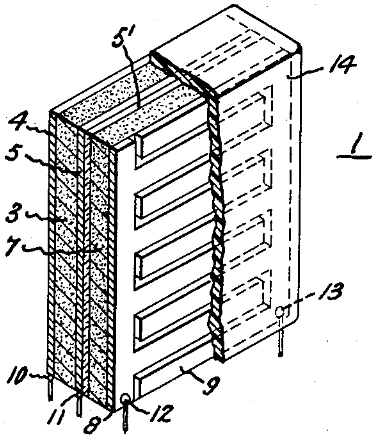

The novel features believed characteristic of the invention are set forth in the appended claims. The invention itself, together with further objects and advantages thereof, may best be understood with reference to the following description taken in conjunction with the accompanying drawings in which, Figure 1 is a partially cut-away perspective view of a signal translating device constructed in accord with the invention, Figure 2 is a schematic circuit diagram of an electric signal translating circuit including the device of Figure 1, and Figure 3 is a partially cut-away perspective view of a modification of the device of Figure 1.

Figure 1:
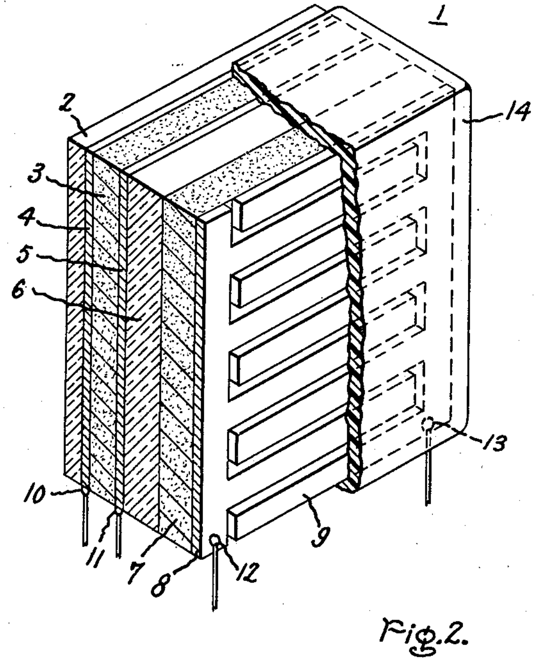

In Figure 1, signal translating device 1 comprises a first light filter 2, a layer of a photoluminescent phosphor material 3 spaced between transparent conducting films 4 and 5, a second light filter 6, a layer of photoconductive material 7 and a pair of interleaved, interdigital electrodes 8 and 9 in contact with separate surface portions of photosensitive layer 7. A pair of input terminal connections 10 and 11 are made to transparent conducting films 4 and 5, respectively, and a pair of output terminal connections 12 and 13 are made to interdigital electrodes 8 and 9, respectively.

Photoluminescent layer 3 may be composed of any photoluminescent material which emits non-thermal, long wavelength radiation when irradiated by short wavelength radiation and which satisfies the following three conditions. The first condition is that in the phosphor, luminescence is produced by surface absorption of incident radiation having a wavelength shorter than the fundamental absorption edge of the phosphor. In this case, the host lattice of the phosphor absorbs the incident radiation near the surface thereof with the resultant creation and luminescent recombination of free electrons and holes. The second condition is that, of the free electrons and holes created by the above absorption, one of the two must have a much greater mobility in the phosphor lattice than the other. The third condition is that luminescent recombination of electrons and holes in the phosphor be strongly dependent upon the instantaneous density of the more mobile charge carriers in the absorption region. The reasons for these requirements will be explained in detail hereinafter. As an example of phosphors which satisfy the above-mentioned conditions, photoluminescent layer 3 may comprise photoluminescent phosphors of the zinc-cadmium sulfo-selenide family activated with photoluminescence-inducing concentrations of such activators as silver, gold, copper, arsenic, and phosphorus. All of these phosphors are, of course, coactivated with a material such as a halide as for instance chlorine or an element from group 3B of the periodic table of the elements, in the same percentage as the activator. Thus, for example, some specific phosphors which have been used in constructing devices in accord with the invention include zinc sulfide activated with 0.01 weight percent of silver and chlorine (ZnS: 0.01% AgCl); zinc sulfide activated with 0.01 weight percent copper and aluminum (ZnS:0.01% CuAl); zinc-cadmium sulfide (35%, 50%, and 85% cadmium) activated with 0.01 weight percent silver and chlorine (ZnCdS (35% Cd):0.01% AgAl; ZnCdS: (50% Cd): 0.01% AgCl; and ZnCdS: (85% Cd):0.01% AgCl); and zinc sulfo-selenide (20% selenium) activated with 0.01 weight percent copper and chlorine (ZnSSe (20% Se):0.01% CuAl). These specific phosphors are listed as exemplary phosphors only, and it is to be understood that any phosphor satisfying the above conditions is suitable for use in the practice of the invention.

Photoluminescent phosphors which satisfy the above conditions are to be distinguished from electroluminescent phosphors which, in general, contain greater concentrations of activator impurities. These photoluminescent phosphors are susceptible to polarity-dependent, alternating field modulation of photoluminescence in accord with the invention. For the purposes of this specification and the appended claims photoluminescent phosphors which satisfy the foregoing conditions shall be denominated as "polarity-dependent field modulatable photoluminescent phosphors."

The material comprising photoconductive layer 7 is chosen to be responsive to the emission of photoluminescent layer 3. By a photoconductive material is meant a material the electrical impedance of which varies markedly with incident radiation. Numerous such materials are well known to the art. For example, subject to the requirement that photoconducting material 7 be responsive to the emission of photoluminescent layer 3, photoconducting layer 7 may conveniently comprise any of the sulfides, selenides or tellurides of zinc, cadmium or lead. Both photoluminescent layer 2 and photoconducting layer 7 may comprise a matrix of microcrystals of appropriate materials bound with a suitable dielectric binder, a matrix of properly oriented single crystals or a continuous crystalline layer of the appropriate material deposited by evaporation or vapor deposition techniques well known to the art. Transparent conducting electrodes 4 and 5 may be thin semi-transparent layers, a fraction of a micron thick, of a metal such as aluminum or silver. These electrodes may also comprise thin transparent layers of tin oxide known to the art as "conducting glass" or titanium dioxide prepared in accord with the method disclosed and claimed in U.S. Patent 2,732,313 to Cusano and Studer.

Interdigital electrodes 12 and 13 comprise a suitable array of conductive members which may conveniently be scribed lines of silver or aluminum paste, or may be made of any of the evaporated or vapor deposited materials described with respect to transparent conductors 4 and 5. It is not necessary that electrodes 12 and 13 be of the interdigital type, and be made to the same surface of photoconducting layer 7. Thus, for example, the device operates equally as well if electrodes 12 and 13 were made to opposite surfaces of layer 7, the only requirement being that the electrode interposed between photoluminescent layer 3 and photoconducting layer 7 be transparent to the emission of photoluminescent layer 3. This may readily be achieved if this electrode is a transparent conducting film of tin oxide or titanium dioxide.

Second light filter 6 is a filter chosen to transmit substantially all of the emission of photoluminescent phosphor 3 but to prevent the transmission to photoconducting layer 7 of any radiation having a wavelength shorter than the shortest characteristic wavelength emitted by photoluminescent layer 3. This characteristic of filter 6 is chosen in order that photoconductor 7 which, in the operation of signal translating device 1, is to be stimulated by the emission of photoluminescent layer 3, is not subjected to spurious stimulation by external light of shorter wavelength than the emission of photoluminescent layer 3 which might be transmitted therethrough. First light filter 2 is chosen to pass radiation having a wavelength shorter than the fundamental absorption edge of photoluminescent material 3. The characteristics of this filter may further be expressed by stating that it is designed to block the transmission of all long wavelength radiation which is not absorbed in the surface adjacent portion of the photoluminescent material comprising layer 3. Filter 6 is chosen to pass the wavelength radiation characteristically blocked by filter 2 which includes the emission of photoluminescent phosphor layer 3 and to block the transmission or radiation characteristically transmitted by filter 2. Suitable filters satisfying the above criteria may be obtained commercially. Some suitable filters are listed in a pamphlet entitled "Glass Color Filters" obtainable from Corning Glass Works, Corning, New York.

One device constructed in accord with Figure 1 comprised a Corning #7-37 glass filter as first filter 2. Transparent conducting films 4 and 5 comprised vapor deposited transparent films of tin oxide. Photoluminescent film 3 comprised a suspended powder zinc-cadmium (50% Cd) sulfide phosphor activated with 0.01% by weight of silver and chlorine. Second filter 6 comprised a Corning #3-69 glass filter. Photoconducting layer 7 comprised a crystalline layer of cadmium sulfide, and interdigital electrodes 8 and 9 comprised thin, interleaved strips of silver paste. The entire device, excluding the exterior exposed face of filter 2, was incapsulated with an opaque layer 14 by wrapping with a pigmented polyvinyl chloride tape. Layer 14 may comprise any suitable plastic or resinous opaque insulating material, many of which are well known to the art.

While in Figure 1, photoluminescent layer 3 and photosensitive layer 7 are shown as individual layers in parallel spaced relationship, it should be appreciated that this particular structure, although the preferable embodiment, is not essential to the operation of the device in Figure 1. The only concrete requirement is that the photoluminescent member and the photosensitive member of the device be located in radiation coupled relationship with one another. By radiation coupled relationship is meant any geometry and configuration such that the photosensitive member is exposed to the radiation of the photoluminescent member and exhibits a marked change in electrical impedance when photoluminescent member is excited to luminescence. In the preferred embodiment maximum light coupling is attained with a simple structure which is rugged, easily prepared and inexpensive.

Thus for example, it is not essential that the device of Figure 1 be constructed in one unitary unit composed of parallel and adjacent layers. As an alternative structure, the signal translating device of the invention may comprise two individual units, one embodying the photoluminescent member and the two attendant filters, and the other embodying the photosensitive member and its attendant electrodes, both of which are positioned within an enclosure or envelope having a light opaque wall so that the photo-sensitive member is completely excluded from all radiation to which it is sensitive other than that emitted by the photoluminescent member and passed by its output filter. The photosensitive member need not be a photoconducting layer but may, for instance, be a photovoltaic member which develops an electromotive force when irradiated by incident radiation, the E.M.F. developed being proportional to the intensity of the incident radiation. In some selected instances the photosensitive member may even be an active electronic circuit element such as a photomultiplier tube also enclosed with the photoluminescent member in a light opaque envelope or enclosure.

In Figure 2 of the drawing there is shown a schematic circuit diagram of a signal translating circuit embodying the device of Figure 1. In Figure 2, signal translating device 1 of Figure 1 is connected for a translation of alternating current signals. A signal input is applied through capacitor 15 and is developed across resistor 16 and applied to terminals 10 and 11 of device 1, connecting the signal voltage between transparent conducting films 4 and 5 and impressing an alternating voltage representative of the input signal across photoluminescent layer 3. A source of radiation 17 emitting radiation having at least a component thereof with a wavelength shorter than the fundamental absorption edge of the phosphor of layer 3, passes through filter 2 and uniformly irradiates photoluminescent phosphor 3. Source 17 may be an ultra-violet lamp, an electroluminescent cell, or radiation from any source such as the sun, the radiation from which possesses a component having a component shorter than the fundamental absorption edge of phosphor 3. The emission of photoluminescent phosphor 3 passes through filter 6 which passes its emission, but excludes any spurious radiation from source 17 and allows this emission to fall upon photoconducting layer 7. The electrical impedance of photoconductor layer 7 varies in accord with the light emission of photoluminescent phosphor 3 which, in turn, varies in intensity in accord with the alternating voltage signal applied thereto. A source of unidirectional electric potential represented generally as battery 18 impresses a unidirectional voltage between electrodes 8 and 9 in contact with different surface regions of photoconducting layer 7, and a unidirectional voltage is developed across load resistance 19. When, however, the conductivity of photoconducting layer 7 varies in accord with the emission of photoluminescent layer 3, which in turn varies with the alternating signal applied thereto, an alternating voltage component is developed across load resistance 19 which is an amplified image of the signal voltage across resistance 16. Thus when signals are applied through condenser 15 and resistance 16, impressing a signal voltage upon photoluminescent layer 3, these signals are reproduced faithfully with negligible distortion in greater intensity across load resistance 19, between output terminals 20 and 21 thereof, providing a circuit for the translation of alternating current signals. It should be noted that the magnitude of signal voltages which may be applied between terminals 10 and 11 in the operation of the invention is very low, and is particularly lower than the magnitude of voltage required, for example, to stimulate electroluminescence. Device 1 is responsive to signals establishing a field through layer 3 from 10 to $10^3$ volts per centimeter.

I have found that the photoluminescent emission of a phosphor excited to luminescence by radiation of a wavelength shorter than its fundamental absorption edge may be modulated as much as 50% with negligible distortion by the application of a low level alternating voltage thereto such that the resulting alternating electric field has a magnitude of from 10 to $10^3$ volts per centimeter and is perpendicular in direction to the surface of the phosphor. The device of Figure 1 and the circuit of Figure 2 operate upon the aforementioned principle which I have discovered. This photoluminescent modulation facilitates the transformation of weak electrical signals into relatively strong light signals which may subsequently be reconverted into strong electrical signals with the attainment of amplification. The term "fundamental absorption edge" with respect to a photoluminescent phosphor designates the wavelength of exciting radiation, the photon energy of which is sufficient to raise an electron in the crystal lattice of the phosphor from the valence band to the conduction band. Incident radiation having a wavelength shorter than the fundamental adsorption edge of a given phosphor is characteristically absorbed thereby, while radiation having a longer wavelength is characteristically transmitted by the phosphor crystal lattice. For a further treatment of the concept of the fundamental absorption edge of luminescent phosphors, reference is hereby made to the text "Luminescent Materials" by Garlick published in 1949 by Oxford at the Clarendon Press, page 22.

In the operation of the circuit of Figure 2, electromagnetic radiation having at least a component thereof having a wavelength shorter than the fundamental absorption edge of phosphor 3 is directed from source 17 upon a signal translating device 1 and first falls upon filter 2. Since filter 2 is chosen to pass only radiation having a wavelength shorter than the absorption edge of phosphor 3, this short wavelength light passes through filter 2, through transparent conducting film 4 and is incident upon photoluminescent phosphor 3, which is consequently excited to luminescence and emits its characteristic emission. Should any of the exciting radiation from source 17 not be absorbed in layer 3 and should such light be transmitted to filter 6 it is blocked thereby and prevented from passing through to photoconducting layer 7 to change the conductivity characteristics thereof. Radiation emitted by photoluminescent layer 3 must, by definition, occur at greater wavelengths than its fundamental absorption edge, since photoluminescent phosphors are transparent to their own emission. The emission of phosphor layer 3 is passed by filter 6 and is incident upon photoconductive layer 7. The conductivity characteristics of photoconductive layer 7 change in accord with the intensity of this emission causing a modulated current to flow between terminals 12 and 13 when a unidirectional potential is applied thereto. An alternating voltage signal is applied across input resistance 16 to terminals 10 and 11 connected respectively to transparent conducting films 4 and 5 and impresses an alternating electric field across photoluminescent layer 3. In accord with my discovery, the application of this alternating electric field to phosphor layer 3 causes a corresponding undistorted modulation of the photoluminescent output of phosphor 3, and a consequent modulation of the electrical impedance of photoconductive layer 7. Signal information applied across input resistance 16 is faithfully reproduced across output resistance 19 with an increase in amplitude which corresponds to the gain of the device. As an example of the low voltage responsiveness of the device of the invention, in one application audio signals were detected directly from a conventional crystal phonograph pick-up having a maximum voltage output of approximately 1 volt.

Although filters 2 and 6 are useful in making certain that photoconductive element 7 is irradiated by radiation which emanates from photoluminescent layer 3 only it is possible, in constructing devices in accord with the invention, to eliminate these filters without affecting the operation of the device. In order to eliminate these filters, it is only necessary that the source of short wavelength radiation 17 be chosen to have no emission components which are not absorbed by photoluminescent layer 3 and to which photoconductive layer 7 is responsive. This is so because the sole purpose of filters 2 and 6 is to assure that the only radiation influencing the impedance of photoconductive layer 7 emanates from photoluminescent layer 3. Thus, for example, if the source 17 is an electroluminescent cell emitting blue radiation of a narrow spectral distribution to which photoconducting layer 7 is insensitive, both filters 2 and 6 may be dispensed with. A modified device constructed without filters is illustrated in Figure 3 of the drawing. Like numerals to those utilized in Figure 1 identify like structural components. In Figure 3, signal translating device 1 comprises a photoluminescent layer 3 disposed in parallel spaced relation between transparent conducting films 4 and 5, an insulating layer 5′ of transparent material and a photoconducting layer 7 adjacent thereto having connected to an exposed surface thereof a pair of interdigital electrodes 8 and 9. Input terminals 10 and 11 are made to transparent conducting films 4 and 5 respectively, and output terminals 12 and 13 are made to interdigital electrodes 8 and 9 respectively. As an example of components which were utilized in constructing a device such as illustrated in Figure 3, and a corresponding source of radiation, source 17 was an argon glow lamp (G.E. AR–1), photoluminescent layer 3 comprised ZnCd (50%):AgCl (0.01%), and photoconducting layer 7 comprised a sintered layer of cadmium sulfide crystals. In this case the output of source 17 had no component of radiation to which photosensitive layer 7 was sensitive. The emission had a wavelength shorter than the fundamental absorption edge of photoluminescent layer 3 so that all the requirements of the invention were satisfied and the device operated substantially as is described with respect to the device of Figure 1.

The phenomenon of photoluminescent modulation which is responsible for the operation of the devices and circuits of this invention is believed to function as follows: When a photoluminescent phosphor is excited by radiation having a wavelength shorter than its fundamental absorption edge, the phosphor is excited to luminescence. However, the excitation occurs substantially at the surface and the surface adjacent region of the phosphor since wavelengths shorter than the fundamental absorption edge of the phosphor are strongly absorbed thereby and do not penetrate deeply within the body of the phosphor. The mechanism of excitation by absorption of incident radiation by the host lattice is believed to be that the incident radiation causes the creation of free electrons and holes which, upon recombination, cause the emission of photons of visible light. When a photoluminescent phosphor is so irradiated and luminescence is observed, the application of a normal alternating field across the thickness of the phosphor layer causes the more mobile carriers, generally electrons, to be alternately swept away from, and back into, the surface adjacent region of the phosphor. When the polarity of the alternating voltage applied to the phosphor is such that the electrons are swept out of the surface adjacent region, the positive holes remain in that region and recombination of the electrons with positive holes becomes a less probable event, consequently the intensity of the photoluminescent radiation is sharply decreased. On the other hand, when electrons which have been swept out of the surface adjacent region of the phosphor, are once again returned thereto by a reversal of the polarity of the applied alternating voltage, those electrons, which were unable to recombine when swept out of the surface adjacent region, combine with positive holes, at the same time that other newly-created free electrons and holes are combining, thus causing a much higher intensity of emission therefrom than would occur without the application of an alternating voltage applied to the phosphor. The radiation intensity which is lost when electrons are swept away from the surface adjacent region of the phosphor is thus regained upon the next alternation of the applied alternating voltage. Hence the motion of the mobile charge carriers upon which photoluminescent modulation is dependent is responsive to the polarity, as well as the magnitude of the applied alternating electric field. The characteristic of polarity-dependent photoluminescent modulation is necessary in order that frequency fidelity be attained. Since the input electrical signals are used only to control the luminescent emission of the photoluminescent material, rather than to supply the energy to cause such emission, electrical amplification may readily be attained from the devices and circuits of the invention.

The mechanism of photoluminescent modulation is to be distinguished from electroluminescence, the distinguishing features being those which make the operation of devices in accord with this invention possible. In electroluminescence fields the order of $10^4$ volts per centimeter are generally required. Furthermore, the light output of an electroluminescent phosphor, when excited by an alternating electric field is not polarity-dependent and exhibits two peaks for each cycle of the applied alternating voltage and thus, frequency distortion is present. In photoluminescent modulation, on the other hand, the modulation of photoluminescent emission varies identically with the applied alternating voltage and, hence, no frequency distortion is present.

While the above description is believed to give a scientific explanation for the observed phenomenon upon which the devices and circuits of this invention operate it is offered as a scientific explanation of the observed phenomenon only, and is not intended to affect the scope of validity of the appended claims in case a later explanation is found more accurate or comprehensive.

Devices and circuits constructed in accord with the present invention exhibit a number of useful characteristics and may be used in a varied number of electronic applications. As an example of such applications, one such circuit substantially as illustrated in Figure 2 and including a device 1 which comprised radiation coupled photoluminescent and photosensitive members were utilized to amplify the output of a conventional phonograph pickup. The source of incident radiation utilized was filtered sun light which, of course, has short wavelength components. The output of the signal translating circuit as illustrated in Figure 2 was fed into an audio amplifier, the output of which operated a loud speaker which reproduced faithfully the intelligence contained upon the phonograph record. In this application the amplifier as illustrated in Figure 2 of the drawing faithfully reproduced the audio signals derived from the phonograph pickup device. In another application a device similar to that used to amplify the output of a phonograph pickup was utilized as an amplification circuit in a conventional superheterodyne radio and passed all audio components with substantially no distortion.

The devices and circuits of the invention therefore are useful components which may be used as signal translating circuits for the translation of audio signals and signals ranging up in the hundreds of kilocycle ranges. These devices exhibit many useful characteristics among which are electrical gain, a wide bandwidth, substantial absence of distortion, an electrical insulation between input and output circuits, lower power consumption, small size and high durability and ruggedness as compared with many other electronic signal translating devices and circuits.

While the invention has been described with respect to certain embodiments thereof many changes will immediately occur to those skilled in the art. Accordingly, I intend, by the appended claims, to cover all such modifications and changes as fall within the spirit and scope of the foregoing disclosure.

What I claim as new and desire to secure by Letters Patent of the United States is:

1. A signal translating device comprising in radiation coupled relationship, a polarity-dependent field modulatable photoluminescent member and a photosensitive member, said photoluminescent member emitting long wave-length radiation when irradiated with short wavelength radiation, said photosensitive member being sensitive to the emission of said photoluminescent member, means for applying alternating voltage signals sufficient to impress an electric field of 10 to $10^3$ volts per centimeter across said photoluminescent member, a pair of electrical contacts to different surface portions of said photoconductive member, means for irradiating said photoluminescent member with radiation having no component of wavelength longer than the fundamental absorption edge of said member to cause only the region thereof adjacent the irradiated surface to be excited to luminescence and means for excluding all radiation to which said photosensitive member is sensitive other than the emission of said photoluminescent member from said photoconductive member.

2. A signal translating device comprising in radiation coupled relationship, a layer of a polarity-dependent field modulatable photoluminescent material and a layer of a photoconductive material, said photoluminescent material emitting long wavelength radiation when irradiated by short wavelength radiation, said photoconductive member exhibiting a change in electrical impedance when irradiated by the emission of said photoluminescent layer, a first pair of transparent conducting electrodes contacting opposite major surfaces of said photoluminescent layer, a second pair of electrodes contacting different surface portions of said photoconductive layer, means for irradiating said photoluminescent material with radiation having no component of wavelength longer than the fundamental absorption edge of said material to cause only the region thereof adjacent the irradiated surface to be excited to luminescence and means for excluding all radiation to which said photoconductive member is sensitive other than the emission of said photoluminescent member from said photoconducting member.

3. A signal translating device comprising in radiation coupled relationship, a layer of a polarity-dependent field modulatable photoluminescent material and a layer of a photoconductive material, said photoluminescent material emitting a characteristic emission spectra of long wavelength radiation when irradiated by short wavelength radiation, said photoconductive member exhibiting a change in electrical impedance when irradiated by the emission of said photoluminescent layer, a first pair of transparent conducting electrodes contacting opposite major surfaces of said photoluminescent layer, a said second pair of electrodes contacting different surface portions of said photoconductive layer, a first filter which passes only radiation having a wavelength shorter than the fundamental absorption edge of the material comprising said photoluminescent layer and capable of selectively exciting to luminescence a surface adjacent region thereof only juxtaposed adjacent one of said first pair of transparent conducting electrodes, a second filter which passes only radiation having a wavelength longer than the fundamental absorption edge of the material comprising said photoluminescent layer juxtaposed adjacent the other of said first pair of transparent conducting electrodes and between said photoluminescent layer and said photoconductive layer, and means for excluding all radiation to which said photoconductive member is sensitive other than the emission of said photoluminescent layer from said photoconducting member.

4. A signal translating device comprising in sequence a first light filter, a first transparent conducting electrode, a layer of a polarity-dependent field modulatable photoluminescent material which emits long wavelength radiation when irradiated by short wavelength radiation, a second transparent conducting electrode, a second filter, a layer of photoconductive material which exhibits a change in electrical impedance when irradiated by the emission of said photoluminescent layer, a pair of interdigital electrodes contacting different portions of an exposed surface of said layer of photoconductive material, said first filter having the characteristic of passing only radiation having wavelength shorter than the fundamental absorption edge of the material comprising said photoluminescent layer and selectively exciting to luminescence a surface adjacent region thereof only, said second filter having the characteristic of passing only radiation having wavelength longer than the fundamental absorption edge of the material comprising said photoluminescent layer, and means for excluding all radiation to which said photoconductive member is sensitive other than the emission of said photoluminescent member from said photoconducting member.

5. A signal translating circuit comprising a signal translating device including in radiation coupled relationship, a layer of a polarity-dependent field modulatable photoluminescent material and a layer of a photoconductive material, said photoluminescent material emitting long wavelength radiation when irradiated by short wavelength radiation, said photoconductive layer exhibiting a change in electrical impedance when irradiated by the emission of said photoluminescent layer, a first pair of transparent conducting electrodes contacting opposite major surfaces of said photoluminescent layer, a second pair of electrodes contacting different surface portions of said photoconductive layer, means for excluding all radiation to which said photoconductor is sensitive other than the emission of said photoluminescent layer from said photoconducting layer a source of radiation having an emission spectra having at least a component thereof of wavelength shorter than the fundamental absorption edge of the material comprising said photoluminescent layer and capable of selectively exciting a surface adjacent region only thereof to luminescence juxtaposed with relation to said device so that the emission thereof is incident upon said photoluminescent layer and filter means interposed between said source and said photoluminescent layer and passing only radiation having wavelength shorter than the fundamental absorption edge of said photoluminescent layer.

6. A signal translating circuit comprising a signal translating device including in radiation coupled relationship, a layer of a polarity-dependent field modulatable photoluminescent material and a layer of a material, said photoluminescent material emitting long wavelength radiation when irradiated by short wavelength radiation, said photoconductive layer exhibiting a change in electrical impedance when irradiated by the emission of said photoluminescent layer, a first pair of transparent conducting electrodes contacting opposite major surfaces of said photoluminescent layer, a second pair of electrodes contacting different surface portions of said photoconductive layer, and means for excluding all radiation to which said photoconductive layer is sensitive other than the emission of said photoluminescent layer from said photoconducting layer, a source of radiation having an emission spectra having at least a component thereof of wavelength shorter than the fundamental absorption edge of the material comprising said photoluminescent layer and capable of selectively exciting a surface adjacent region only thereof to luminescence juxtaposed with relation to said device so that the emission thereof is incident upon said photoluminescent layer; filter means interposed between said source and said photoluminescent layer and passing only radiation having wavelength shorter than the fundamental absorption edge of said photoluminescent layer, means for applying alternating voltage signals sufficient to impress an electric field of 10 to $10^3$ volts per centimeter across said photoluminescent phosphor between said first pair of transparent conducting electrodes, and a load device connected in series circuit relationship with said second pair of electrodes.

7. A signal translating circuit comprising a signal translating device including in radiation coupled relationship, a layer of a polarity-dependent field modulatable photoluminescent material and a layer of a photoconductive material, said photoluminescent material emitting long wavelength radiation when irradiated by short wavelength radiation, said photoconductive layer exhibiting a change in electrical impedance when irradiated by the emission of said photoluminescent layer, a first pair of transparent conducting electrodes contacting opposite major surfaces of said photoluminescent layer, a second pair of electrodes contacting different surface portions of said photoconductive layer, and means for excluding all radiation to which said photoconductive layer is sensitive other than the emission of said photoluminescent layer from said photoconducting layer; a source of radiation having an emission spectrum having at least a component thereof of wavelength shorter than the fundamental absorption edge of the material comprising said photoluminescent layer and capable of selectively exciting a surface adjacent region only thereof to luminescence juxtaposed with relation to said device so that the emission thereof is incident upon said photoluminescent layer; means for filtering from said emission spectrum all radiation having wavelength longer than the fundamental absorption edge of said photoluminescent material, means for applying alternating voltage signals sufficient to impress an electric field of 10 to $10^3$ volts per centimeter across said photoluminescent layer between said first pair of transparent conducting electrodes and a source of unidirectional voltage and a load device connected in series circuit relationship with said second pair of electrodes.

References Cited in the file of this patent

UNITED STATES PATENTS

| | | |
|---|---|---|
| 2,151,785 | Lubszynski et al. | Mar. 28, 1939 |
| 2,780,731 | Miller | Feb. 5, 1957 |
| 2,795,730 | Fromm et al. | June 11, 1957 |

(Other references on following page)

OTHER REFERENCES

Marxhall et al.: "Optical Elements for Computers," Quarterly Report No. 6, Computer Components Fellowship No. 347, Mellon Institute of Industrial Research, University of Pittsburgh; June 1952.

Loebner: "Opto-Electronic Devices and Networks," Proc. of the Inst. of Radio Eng., December 1955, pages 1897–1906.

Destriau et al.: "Electroluminescence and Related Topics," Proc. of I.R.E., December 1955, pages 1911–1940.